(12) United States Patent
Yamasaki et al.

(10) Patent No.: US 10,731,248 B2
(45) Date of Patent: Aug. 4, 2020

(54) VACUUM PROCESSING APPARATUS AND OPERATION METHOD THEREOF

(71) Applicant: TOKYO ELECTRON LIMITED, Tokyo (JP)

(72) Inventors: Hideaki Yamasaki, Nirasaki (JP); Shinya Okabe, Nirasaki (JP); Takeshi Itatani, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 313 days.

(21) Appl. No.: 15/405,818

(22) Filed: Jan. 13, 2017

(65) Prior Publication Data

US 2017/0204518 A1    Jul. 20, 2017

(30) Foreign Application Priority Data

Jan. 15, 2016 (JP) .................................. 2016-006450
Dec. 2, 2016 (JP) .................................. 2016-235361

(51) Int. Cl.
| | | |
|---|---|---|
| *C23C 16/54* | (2006.01) | |
| *C23C 16/44* | (2006.01) | |
| *C23C 16/455* | (2006.01) | |

(52) U.S. Cl.
CPC ...... *C23C 16/4412* (2013.01); *C23C 16/4401* (2013.01); *C23C 16/45557* (2013.01); *C23C 16/54* (2013.01)

(58) Field of Classification Search
CPC ................................................. C23C 16/4412
See application file for complete search history.

(56) References Cited

U.S. PATENT DOCUMENTS

| | | | | |
|---|---|---|---|---|
| 2002/0020344 A1* | 2/2002 | Takano | ............. | H01L 21/67017 118/100 |
| 2003/0219977 A1* | 11/2003 | Pomarede | ......... | H01L 21/67017 438/680 |
| 2003/0230322 A1* | 12/2003 | Hillman | ............ | H01L 21/67126 134/11 |
| 2009/0060702 A1 | 3/2009 | Kobayashi et al. | | |
| 2010/0022093 A1* | 1/2010 | Yamaguchi | ....... | H01L 21/67196 438/706 |
| 2011/0194924 A1* | 8/2011 | Kobayashi | ........ | H01L 21/67017 414/805 |

FOREIGN PATENT DOCUMENTS

| | | |
|---|---|---|
| JP | 2006-216710 A | 8/2006 |
| JP | 2009-064873 | 3/2009 |
| KR | 10-2010-0014613 A | 2/2010 |

* cited by examiner

*Primary Examiner* — David P Turocy
(74) *Attorney, Agent, or Firm* — Fenwick & West LLP

(57) ABSTRACT

A vacuum processing apparatus for processing a substrate under a vacuum atmosphere includes a vacuum processing module, a vacuum transfer module, a gate valve and a control unit. The vacuum processing module includes a processing chamber, a mounting table and a first gas supply unit. The vacuum transfer module includes a transfer chamber airtightly connected to the processing chamber through the transfer port, a transfer unit and a second gas supply unit. The gate valve is configured to open and close the transfer port for the substrate. The control unit is configured to open the gate valve in a state where a flow rate of an inert gas supplied from the first gas supply unit is smaller than a flow rate of an inert gas supplied from the second gas supply unit and a pressure in the processing chamber is lower than a pressure in the transfer chamber.

5 Claims, 17 Drawing Sheets

VACUUM PROCESSING APPARATUS AND OPERATION METHOD THEREOF

CROSS-REFERENCE TO RELATED APPLICATIONS

This application claims priority to Japanese Patent Application No. 2016-006450 filed on Jan. 15, 2016 and Japanese Patent Application No. 2016-235361 filed on Dec. 2, 2016, the entire contents of which are incorporated herein by reference.

FIELD OF THE INVENTION

The disclosure relates to a technical field for transferring a substrate between a vacuum transfer module and a vacuum processing module.

BACKGROUND OF THE INVENTION

A multi-chamber system is known as an apparatus for performing vacuum processing that is one of semiconductor device manufacturing processes while ensuring a high throughput. In this system, a plurality of vacuum processing chambers are connected to a common vacuum transfer chamber through respective gate valves, and a substrate is transferred from an atmospheric pressure or an inert gas atmosphere of an ordinary pressure to the common vacuum transfer chamber through a load-lock chamber and then transferred to one of the vacuum processing chambers by a transfer unit in the vacuum transfer chamber. The vacuum processing may include film formation, dry etching, annealing, and the like.

Conventionally, when a semiconductor wafer (hereinafter, referred to as "wafer") is transferred between the vacuum transfer chamber and the vacuum processing chamber, an atmosphere of the vacuum processing chamber is prevented from flowing into the vacuum transfer chamber by opening/closing the gate valve in a state where a pressure in the vacuum transfer chamber is maintained at a level slightly higher than that in the vacuum processing chamber. Depending on a type of processing of the wafer or a structure of the vacuum processing chamber, reaction by-products generated during the processing may be adhered and deposited to an inner surface of the vacuum processing chamber, especially to a vicinity of the gate valve. Accordingly, when the atmosphere inert gas in the vacuum transfer chamber flows into the vacuum processing chamber by opening/closing the gate valve, the reaction by-products may be peeled off and adhered as particles to a surface of the wafer being transferred.

Japanese Patent Application Publication No. 2009-64873 discloses a technique for suppressing adhesion of particles to a surface of a wafer by opening/closing a gate valve after setting a flow rate of a gas in a vacuum processing chamber twice or more than that in a vacuum transfer chamber in a state where a pressure in the vacuum transfer chamber is set to be higher than a pressure in the vacuum processing chamber. However, the flow rate of the gas in the vacuum transfer chamber may be suddenly increased and, thus, the particles may be peeled off. In addition, when the flow rate of the gas in the vacuum processing chamber is set to be greater than that in the vacuum transfer chamber, the particles may scatter into the vacuum transfer chamber.

SUMMARY OF THE INVENTION

In view of the above, the disclosure provides a technique for suppressing adhesion of particles to a substrate at the time of opening/closing a gate valve that partitions between a vacuum transfer module and a vacuum processing module.

In accordance with an aspect, there is provided a vacuum processing apparatus for processing a substrate under a vacuum atmosphere. The vacuum processing apparatus includes a vacuum processing module, a vacuum transfer module, a gate valve, and a control unit. The vacuum processing module includes a processing chamber having a transfer port for a substrate, a mounting table provided in the processing chamber, a first gas supply unit configured to supply a gas in a shower pattern toward the mounting table, and a first gas exhaust port formed below the mounting table and configured to vacuum-evacuate the processing chamber. The vacuum transfer module includes a transfer chamber airtightly connected to the processing chamber through the transfer port, a transfer unit configured to transfer the substrate with respect to the processing chamber, a second gas supply unit configured to supply an inert gas into the transfer chamber, and a second gas exhaust port configured to vacuum-evacuate the transfer chamber. The gate valve is configured to open and close the transfer port for the substrate. The control unit is configured to open the gate valve in a state where a flow rate of an inert gas supplied from the first gas supply unit is smaller than a flow rate of an inert gas supplied from the second gas supply unit and a pressure in the processing chamber is lower than a pressure in the transfer chamber.

In accordance with another aspect, there is provided an operation method of a vacuum processing apparatus including a vacuum processing module, a vacuum transfer module and a gate valve. The vacuum processing module includes a processing chamber having a transfer port for a substrate, a mounting table provided in the processing chamber, a first gas supply unit configured to supply a gas in a shower pattern toward the mounting table, and a first gas exhaust port formed below the mounting table and configured to vacuum-evacuate the processing chamber. The vacuum transfer module includes a transfer chamber airtightly connected to the processing chamber through the transfer port, a transfer unit configured to transfer the substrate with respect to the processing chamber, a second gas supply unit configured to supply an inert gas into the transfer chamber, and a second gas exhaust port configured to vacuum-evacuate the transfer chamber. The gate valve is configured to open and close the transfer port for the substrate. In the method, setting a state in which a flow rate of the inert gas supplied from the first gas supply unit is smaller than a flow rate of an inert gas supplied from the second gas supply unit and a pressure in the processing chamber is lower than a pressure in the transfer chamber; opening the gate valve in the set state; transferring the substrate between the processing chamber and the transfer chamber by the transfer unit; and closing the gate valve.

In the present disclosure, when the substrate is transferred between the vacuum transfer module and the processing chamber of the vacuum processing module, the inert gas is supplied from the space above the mounting table into the processing chamber before the opening of the gate valve that partitions the vacuum transfer module and the vacuum processing module. In that case, the flow rate of the inert gas supplied into the processing chamber is set to be smaller than the flow rate of the inert gas supplied into the vacuum transfer chamber, and the pressure in the processing chamber is set to be lower than the pressure in the vacuum transfer chamber. Therefore, when the gate valve is opened, sudden flow of the inert gas from the vacuum transfer chamber into the processing chamber is suppressed. Accordingly, scattering of reaction by-products adhered to the inner surface of the processing chamber is suppressed and, also, scattering of particles to the surface of the substrate is suppressed. As a result, contamination of the substrate by the particles can be reduced.

BRIEF DESCRIPTION OF THE DRAWINGS

The objects and features of the disclosure will become apparent from the following description of embodiments, given in conjunction with the accompanying drawings, in which.

DETAILED DESCRIPTION OF THE EMBODIMENTS

First Embodiment

Figure 1:
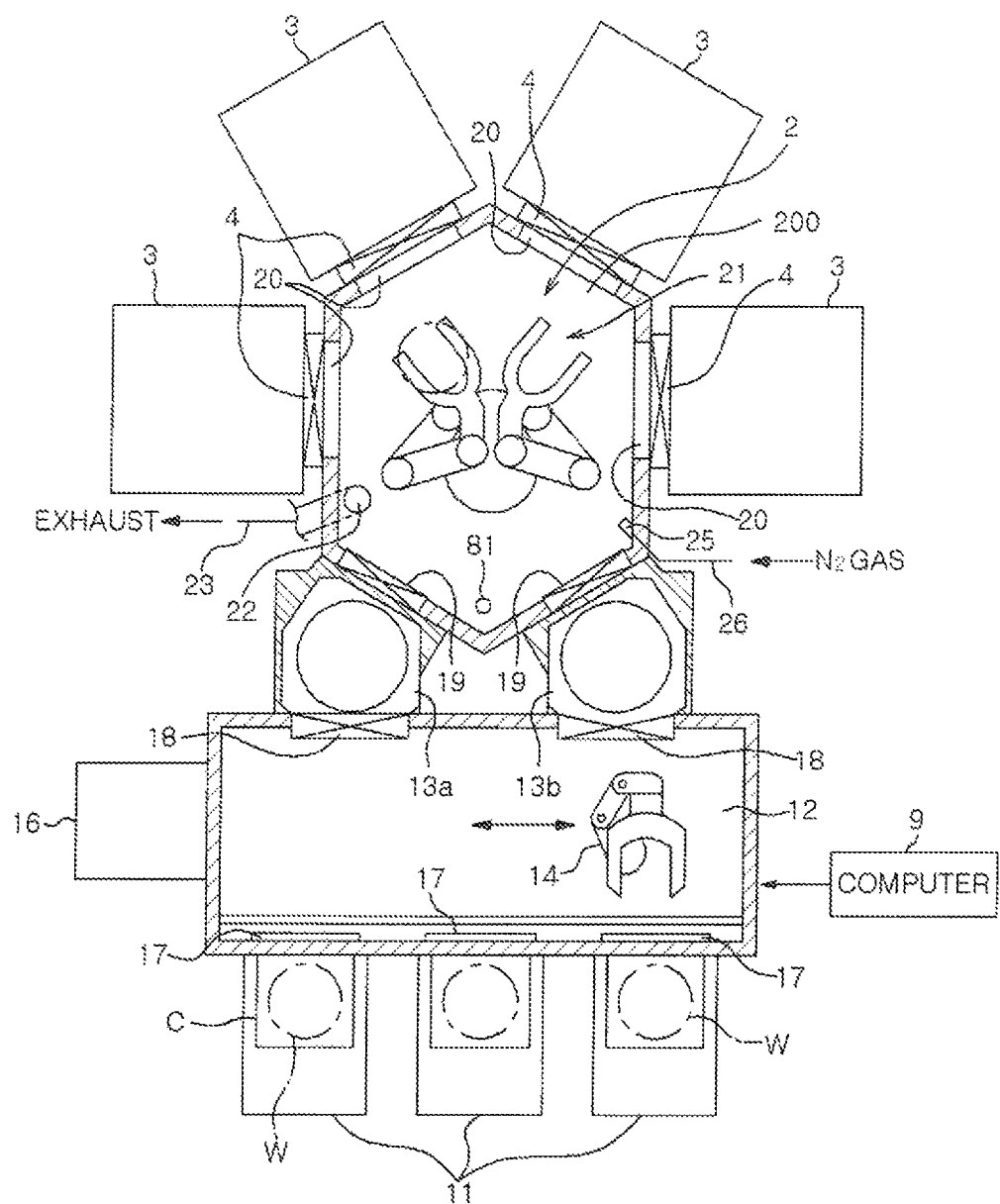
FIG. 1 is a top view showing a vacuum processing apparatus according to a first embodiment.

A vacuum processing apparatus according to a first embodiment which is configured as a multi-chamber system will be described with reference to FIG. 1. The vacuum processing apparatus includes an atmospheric pressure transfer chamber 12 which is horizontally elongated and maintained at an atmospheric pressure by a dry gas, e.g., a dry nitrogen gas. In front of the atmospheric pressure transfer chamber 12, loading/unloading ports 11 for mounting carriers C are arranged in a right-left direction.

Attached to a front wall of the atmospheric pressure transfer chamber 12 are doors 17 that are opened/closed together with lids of the carriers C. A first transfer unit including a joint arm for transferring a wafer W is provided in the atmospheric pressure transfer chamber 12. An alignment chamber 16 for controlling an orientation or an eccentricity of the wafer W is provided at a left wall of the atmospheric pressure transfer chamber 12 when viewed from the loading/unloading ports 11.

Two load-lock chambers 13a and 13b are provided in the right-left direction at a side opposite to the loading/unloading ports 12 with respect to the atmospheric pressure transfer chamber 12. Gate valves 18 are provided between the load-lock chambers 13a and 13b and the atmospheric pressure transfer chamber 12. A vacuum transfer chamber 2 constituting a vacuum transfer module is connected to the load-lock chambers 13a and 13b through gate valves 19 at a rear side of the load-lock chambers 13a and 13b when seen from the atmospheric pressure transfer chamber 12.

Vacuum processing modules 3 are respectively connected to the vacuum transfer chamber 2 through gate chambers 4 where gate valves 40 are provided. In the vacuum transfer chamber 2, a second transfer unit 21 having two transfer arms, each being configured as a joint arm, is provided. The wafer W is transferred between each of the load-lock chambers 13a and 13b and each of the vacuum processing modules 3 by the second transfer unit 21.

Figure 2:
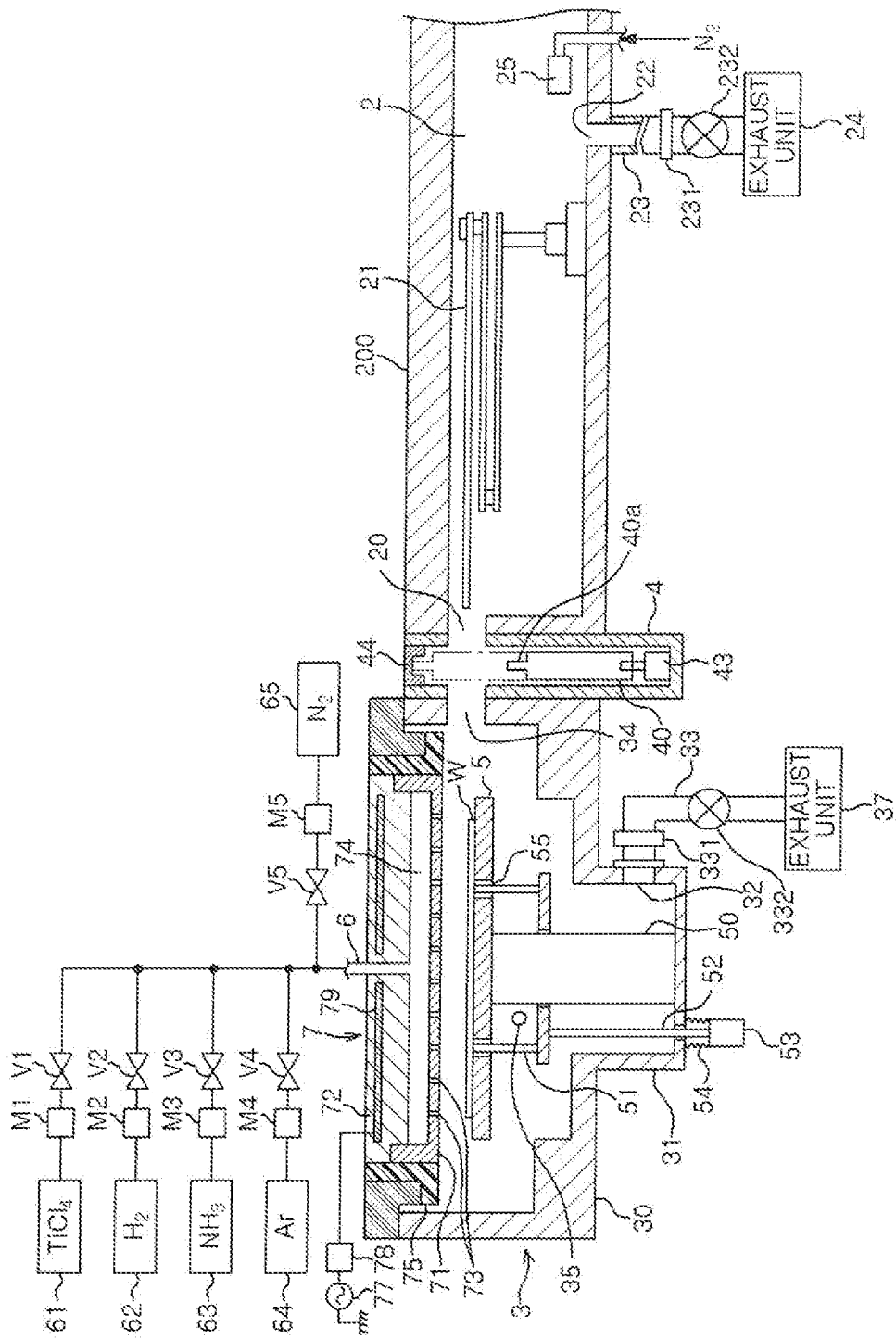
FIG. 2 is a cross sectional view showing a vacuum transfer chamber and a vacuum processing module.
Figure 3:
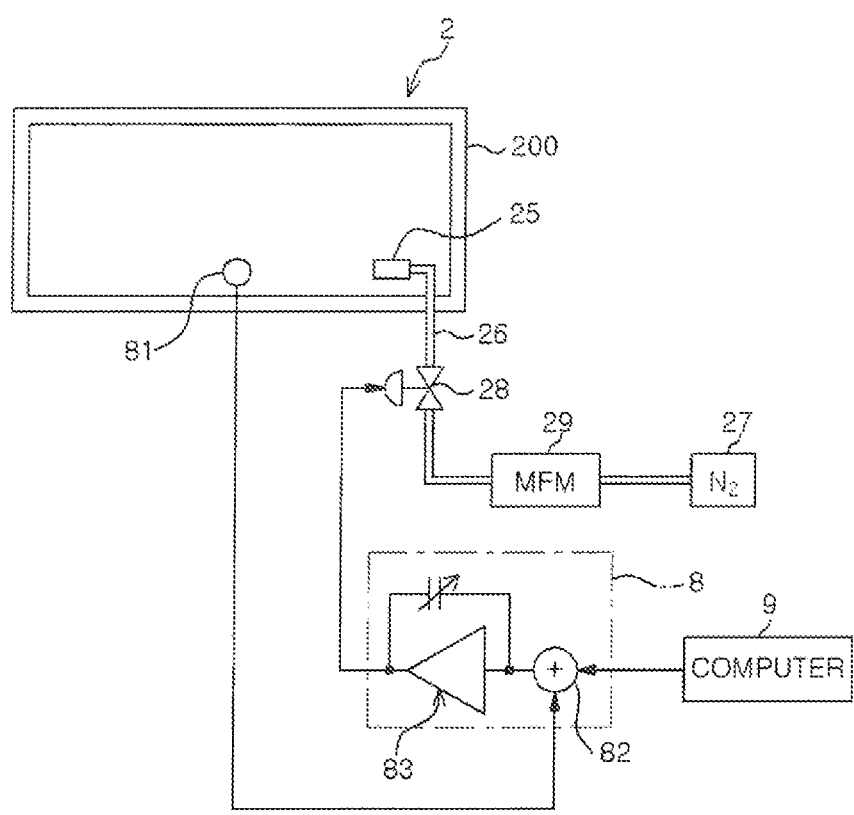
FIG. 3 shows a gas supply unit for supplying $N_2$ gas into the vacuum transfer chamber.

The vacuum transfer chamber 2 will be described with reference to FIG. 2. In the vacuum transfer chamber 2, a gas exhaust port 22 opens at a bottom surface of a vacuum container 200. A gas exhaust line 23 is connected to the gas exhaust port 22. An inner space of the vacuum transfer chamber 2 is vacuum-evacuated by a vacuum exhaust unit 24 including a vacuum pump or a turbo molecular pump. In FIG. 2, a reference numeral 231 represents a pressure control valve and a reference numeral 232 represents an opening/closing valve. An $N_2$ gas supply unit 25 for supplying nitrogen gas ($N_2$ gas) that is an inert gas into the vacuum transfer chamber 2 is provided at a bottom surface of the vacuum transfer chamber 2. As shown in FIG. 3, one end of an $N_2$ gas supply line 26 is connected to the $N_2$ gas supply unit 25 and the other end of the $N_2$ gas supply line 26 is connected to an $N_2$ gas supply mechanism 27. $N_2$ gas is supplied from the $N_2$ gas supply unit 25 into the vacuum transfer chamber 2. A pressure control valve 28 and a mass flow meter (MFM) 29 are installed in that order in the $N_2$ gas supply line 26 from the vacuum transfer chamber 2 side. The inert gas supplied into the vacuum transfer chamber 2 is not limited to $N_2$ gas, and another inert gas such as Ar gas or the like may also be used. The mass flow meter (MFM) 29 may not be provided when a flow rate of a gas flowing into the vacuum transfer chamber is not monitored. A reference numeral 81 in FIG. 1 represents a pressure measurement unit for measuring a pressure in the vacuum container 200.

Referring to FIG. 3, the pressure control valve 28 is connected to a controller 8. The controller 8 includes an adder 82 and a PID operation unit 83. The controller 8 calculates a difference between a pressure set by a computer 9 to be described later and a pressure measured by the pressure measurement unit 81 provided in the vacuum transfer chamber 2 by using the adder (matching circuit) 82. The PID operation unit 83 performs PID operation on the difference and outputs an operation amount to the pressure control valve 28. The operation amount is used for controlling, e.g., an opening degree of the pressure control valve 28. Specifically, the pressure control valve 28 stabilizes a pressure in the vacuum transfer chamber 2 by supplying a predetermined amount of $N_2$ gas so that the amount of $N_2$ gas in the vacuum transfer chamber 2 becomes constant. When the measured pressure is decreased, the difference is increased. Therefore, the pressure in the vacuum transfer chamber 2 is increased by increasing the opening degree of the pressure control valve 28 and increasing the flow rate of $N_2$ gas. When the measured pressure is increased, the difference is decreased. Accordingly, the pressure in the vacuum transfer chamber 2 is decreased by decreasing the opening degree of the pressure control valve 28 and decreasing the flow rate of $N_2$ gas.

Hereinafter, an example in which a film forming apparatus is applied as the vacuum processing module 3 will be described. As shown in FIG. 2, the vacuum processing module 3 is configured as a CVD apparatus for supplying to a wafer W a raw material gas containing $TiCl_4$, $H_2$ gas as a reduction gas, and ammonia ($NH_3$) gas for nitriding. The vacuum processing module 3 includes a cylindrical processing chamber 30 having an upper opening. A cylindrical gas exhaust chamber 31 protruding downward is formed at a central portion of a bottom wall of the processing chamber 30. A gas exhaust port 32 opens at a side surface of the gas exhaust chamber 31. A gas exhaust line 33 is connected to the gas exhaust port 33. A vacuum exhaust unit 37 is connected to the gas exhaust line 33 and configured to decrease a pressure in the processing chamber 30 to a predetermined vacuum level. A reference numeral 331 represents a pressure control valve. A reference numeral 332 represents an opening/closing valve.

A transfer port 34 for loading/unloading the wafer W is provided at a sidewall of the processing chamber 30. The transfer port 34 is connected to the gate chamber 4. The gate chamber 4 is a flat case and has an opening formed at a position corresponding to the transfer port 34 of the processing chamber 30 and an opening formed at a position corresponding to the opening 20 of the vacuum transfer chamber 2. For simple description, these openings are respectively considered as a part of the transfer port 34 and a part of the opening 20.

In the gate chamber 4, a plate-shaped gate valve 40 for blocking the transfer port 34 of the processing chamber 30 is provided. On the bottom surface of the gate chamber 4, an elevation unit 43 is provided below the gate valve 40 to vertically move the gate valve 40. An extremely small gap that does not disturb vertical movement of the gate valve 40 is formed between the gate valve 40 and the wall surface of the gate chamber 4 which faces the vacuum processing module 3. A protrusion 40a is formed at a top surface of the gate valve 40. A groove 44 is formed at a ceiling surface of the gate chamber 4 to correspond to the protrusion 40a. When the gate valve 40 is raised to an upper position indicated by a dashed dotted line in FIG. 2, the protrusion 40a is inserted into the groove 44 and the vacuum processing module 3 and the vacuum transfer chamber 2 are airtightly partitioned. As described above, the gap between the gate valve 40 and the wall surface of the gate chamber 4 which faces the vacuum processing module 3 is extremely small, so that when the gate valve 40 is positioned at the upper position, the transfer port 34 is airtightly sealed. When the gate valve 40 is lowered to a lower position indicated by a solid line in FIG. 2, the transfer port 34 is opened.

A mounting table 5 made of a metal is provided in the processing chamber 30 to substantially horizontally support the wafer W. The mounting table 5 is fixed to a bottom surface of the gas exhaust chamber 31 through a supporting column 50. A heater (not shown) is embedded in the mounting table 5 and configured to heat the wafer W to a set temperature, e.g., 400° C. or above, based on a control signal from the computer 9 to be described later. Further, the mounting table 5 is connected to an installation potential and serves as a lower electrode as will be described later. Three through holes 55 are formed in the mounting table 5 at a regular interval along a circumferential direction. The respective through holes 55 allow penetration of elevating pins 51 for supporting and vertically moving the wafer W on the mounting table 5. The elevating pins 51 are connected to an elevation unit 53 provided at the outside of the processing chamber 30 through an elevation shaft 52. The elevation unit 53 is, e.g., an air cylinder. A reference numeral 54 represents a bellows for airtightly sealing the processing chamber 30. The wafer W is mounted on the mounting table 5 by the cooperation of the elevating pins 51 and the second transfer unit 21 in the vacuum transfer chamber 2.

An upper portion of the processing chamber 30 is blocked, through an insulating member 75, by a gas shower head 7 that is a gas supply unit made of a metal and serves as an upper electrode. A high frequency power supply 77 is connected to the gas shower head 7 via a matching unit 78. The vacuum processing module 3 is configured as a parallel plate type plasma processing apparatus in which a plasma is generated by supplying a gas to be excited into the processing chamber 30 from the gas shower head 7 and applying a high frequency power between the gas shower head 7 serving as the upper electrode and the mounting table 5 serving as the lower electrode.

The gas shower head 7 as a gas supply unit includes a shower plate (diffusion plate) 71 in which gas supply holes penetrating therethrough in a thickness direction are arranged in a matrix pattern. Therefore, the gas can be supplied in a shower pattern toward the mounting table 5. A reference numeral 74 represents a gas diffusion space for diffusing a gas. In the gas shower head 7, a heating unit 79 is embedded in a ceiling member 72 provided above the gas diffusion space 74. The gas shower head 7 is heated to a set temperature by power supplied from a power supply (not shown) to the heating unit 79 based on a control signal transmitted from the computer 9 to be described later.

A downstream end of the gas supply line 6 which penetrates through the ceiling member 72 is connected to the gas shower head 7. An upstream end of the gas supply line 6 is branched and connected to a $TiCl_4$ gas supply source 61, an $H_2$ gas supply source 62, an $NH_3$ gas supply source 63, an Ar gas supply source 64, and an $N_2$ gas supply source 65. In FIG. 2, notations V1 to V5 represent valves and notations M1 to M5 represent flow rate control units. The flow rate control units M1 to M5 include, e.g., mass flow controllers, and control flow rates of gases supplied into the processing chamber 30 to levels set by the computer 9.

A pressure measurement unit 35 for measuring a pressure in the processing chamber 30 is provided at a position on the sidewall of the processing chamber 30 below the mounting table 5.

Hereinafter, a film forming process of the wafer W will be briefly described. The wafer W is mounted on the mounting table 5 and, then, $TiCl_4$ gas, Ar gas and $H_2$ gas as film forming gases are supplied into the processing chamber 30. Next, the high frequency power supply 77 is switched on and a plasma is generated in the processing chamber 30 by applying a high frequency power between the gas shower head 7 and the mounting table 5. Accordingly, $TiCl_4$ gas and $H_2$ gas are activated and react to each other, thereby forming a Ti film on the surface of the wafer W. During the film forming reaction, by-products such as $NH_4Cl$ and the like are generated. As the film forming process proceeds, the reaction by-products are deposited on the inner surface of the processing chamber 30.

Then, the supply of the $TiCl_4$ gas, the Ar gas and the $H_2$ gas and the supply of the high frequency power are stopped and the processing chamber 30 is exhausted. Accordingly, the $TiCl_4$ gas, the Ar gas and the $H_2$ gas are discharged from the processing chamber 30. Then, a process of nitriding a surface of the Ti film is performed by supplying $NH_3$ gas, Ar gas and $H_2$ gas into the processing chamber 30. By supplying the NH$_3$ gas, the Ti film is nitrided and chemical reaction of the following Eq. (1) occurs. As a consequence, a TiN layer is formed thereon.

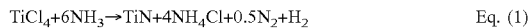

$$TiCl_4 + 6NH_3 \rightarrow TiN + 4NH_4Cl + 0.5N_2 + H_2 \qquad \text{Eq. (1)}$$

A TiN film is formed by laminating the TiN layer on the surface of the wafer W.

In this series of reactions, the by-products such as NH$_4$Cl and the like is generated as described in the Eq. (1). Therefore, the by-products are deposited on the inner surface of the processing chamber 30. In addition to the by-products, a Ti-containing material generated by corrosion of the processing chamber 30 or the like is also deposited on the inner surface of the processing chamber 30.

The vacuum processing apparatus includes the computer forming a part of the control unit. The computer 9 includes a program, a memory, and a CPU. The program is stored in a computer storage medium, e.g., a compact disk, a hard disk, a magneto-optical disk or the like, and installed in the computer 9. The program has a group of steps for executing a series of operations including transfer of the wafer W, supply of a gas into each of the vacuum transfer chamber 2 and the vacuum processing module 3, stop of the gas supply, exhaust of the vacuum transfer chamber 2 and the vacuum processing module 3, and transfer of the wafer W between the vacuum transfer chamber 2 and the vacuum processing module 3. A set pressure in the vacuum transfer chamber 2 is stored in the memory of the computer 9. The set pressure is outputted to the adder 82.

Hereinafter, the entire steps of processing the wafer W by the vacuum processing apparatus according to the first embodiment will be described. When the carrier C accommodating therein wafers W is mounted on the loading/unloading port 11, a wafer W in the carrier C is unloaded by the first transfer unit 14 and transferred along a route of the alignment chamber 16→the load-lock chamber 13a (13b) →the vacuum transfer chamber 2. After the wafer W is transferred from the atmospheric pressure transfer chamber 12 to the load-lock chamber 13a (13b), the load-lock chamber 13a (13b) is vacuum-evacuated. Accordingly, the wafer W can be transferred from the load-lock chamber 13a (13b) to the vacuum transfer chamber 2. The second transfer unit 21 unloads the wafer W from the load-lock chamber 13a (13b) and transfers the wafer to the vacuum processing module 3.

Figure 4A:
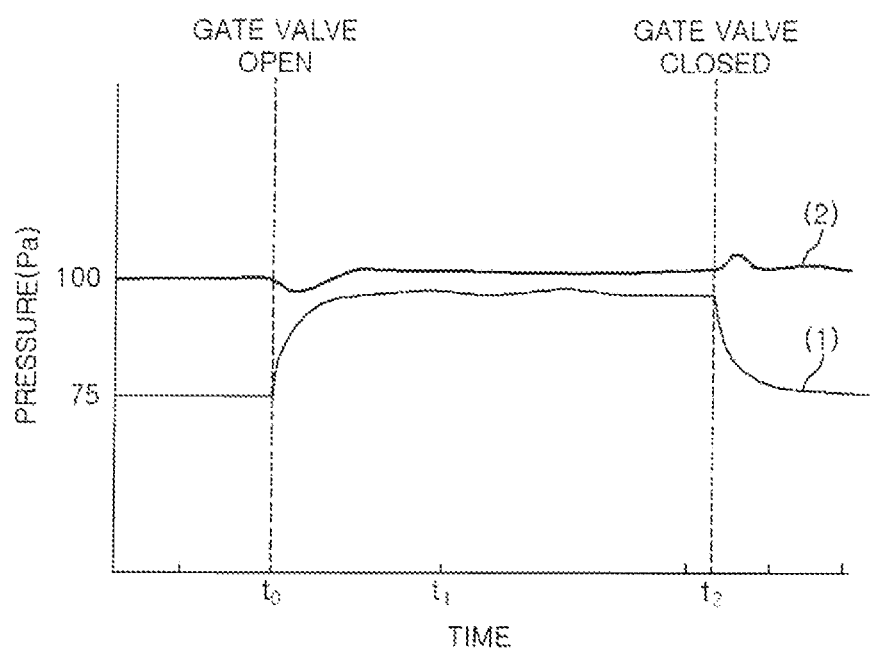
FIGS. 4A and 4B explain pressures in the vacuum transfer chamber and the vacuum processing module and supply flow rates of inert gases at the time of opening/closing a gate valve.
Figure 4B:
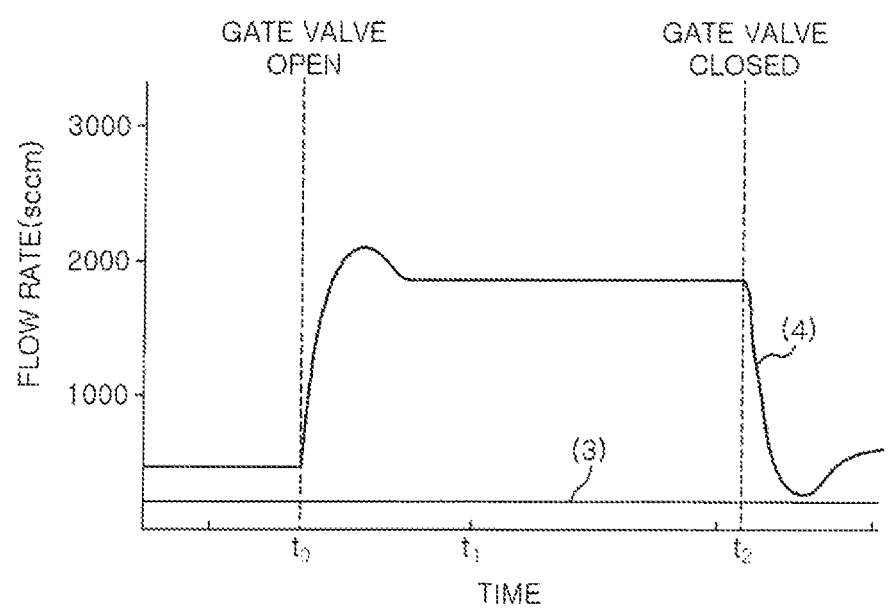

Next, the transfer of the wafer W between the vacuum transfer chamber 2 and the vacuum processing module 3 will be described with reference to FIGS. 4 to 8. FIGS. 5 to 8 schematically illustrate the vacuum processing module 3 and the vacuum transfer chamber 2. Graphs (1) and (2) of FIG. 4A respectively show temporal changes of a measured pressure in the processing chamber 30 and temporal changes of a measured pressure in the vacuum transfer chamber 2 during a period from before the gate valve 40 starts to open to after the wafer W is loaded and the gate valve 40 is closed. Graphs (3) and (4) of FIG. 4B show temporal changes of a flow rate of Ar gas supplied into the processing chamber 30 and temporal changes of a flow rate of N$_2$ gas supplied into the vacuum transfer chamber 2 during a period from before the gate valve 40 starts to open to after the wafer W is loaded and the gate valve 40 is closed. In FIGS. 4A and 4B, the time at which the gate valve 40 starts to open is set to t0; an elapsed time from the opening of the gate valve 40 is set to t1; and the time at which the gate valve 40 is closed is set to t2. In the present embodiment, Ar gas is supplied into the processing chamber 30 before and after the opening/closing of the gate valve 40. However, another inert gas such as N$_2$ gas or the like may be used instead of Ar gas. In the same manner, another inert gas may be supplied into the vacuum transfer chamber 2 instead of N$_2$ gas.

The wafer W in the processing chamber 30 has been subjected to the film forming process and waits for exchange with a next wafer W in the vacuum transfer chamber 2 through two transfer arms of the second transfer unit 21 after the opening of the gate valve 40.

Figure 5:
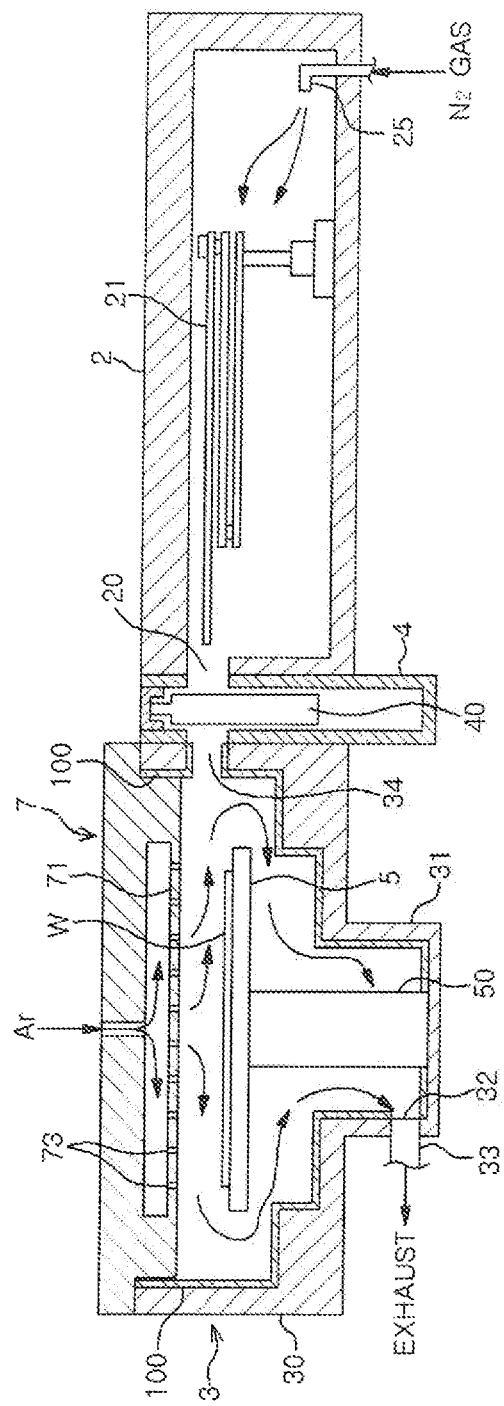
FIGS. 5 to 8 explain operations of the vacuum processing apparatus according to the first embodiment.

Upon transferring the wafer W to the vacuum processing module 3, before the gate valve 40 is opened, Ar gas that is an inert gas is supplied into the processing chamber 30 at a flow rate of, e.g., 200 sccm (ml/min) as shown in FIG. 5. In the vacuum transfer chamber 2, N$_2$ gas is supplied from the N$_2$ gas supply unit 25 at a flow rate of, e.g., 500 sccm. As shown in FIG. 4A, the pressure in the vacuum processing module 3 is set to 75 Pa and the pressure in the vacuum transfer chamber 2 is set to 100 Pa which is higher than the pressure in the processing chamber 30.

In the vacuum processing module 3, as shown in FIG. 5, a Cl compound such as NH$_4$Cl or the like which is produced during the film forming process or a deposit 100 such as a Ti film or the like is adhered to the inner surface of the vacuum processing module 3 during the film forming process. The deposit 100 is also adhered to a top surface of the transfer port 34 or to a wall surface of the processing chamber 30 in the gap between the gas shower head 7 and the processing chamber 30.

Before the time t0, Ar gas is supplied in a shower pattern from the gas shower head 7 toward the mounting table in the processing chamber 30. Thus, the gas flowing downward reaches the surface of the mounting table 5 and flows from the central portion toward the peripheral portion of the mounting table 5. Then, the Ar gas flows downward from the peripheral portion of the mounting table 5 and is discharged through the gas exhaust port 32 provided at the lower portion of the processing chamber 30.

Figure 6:
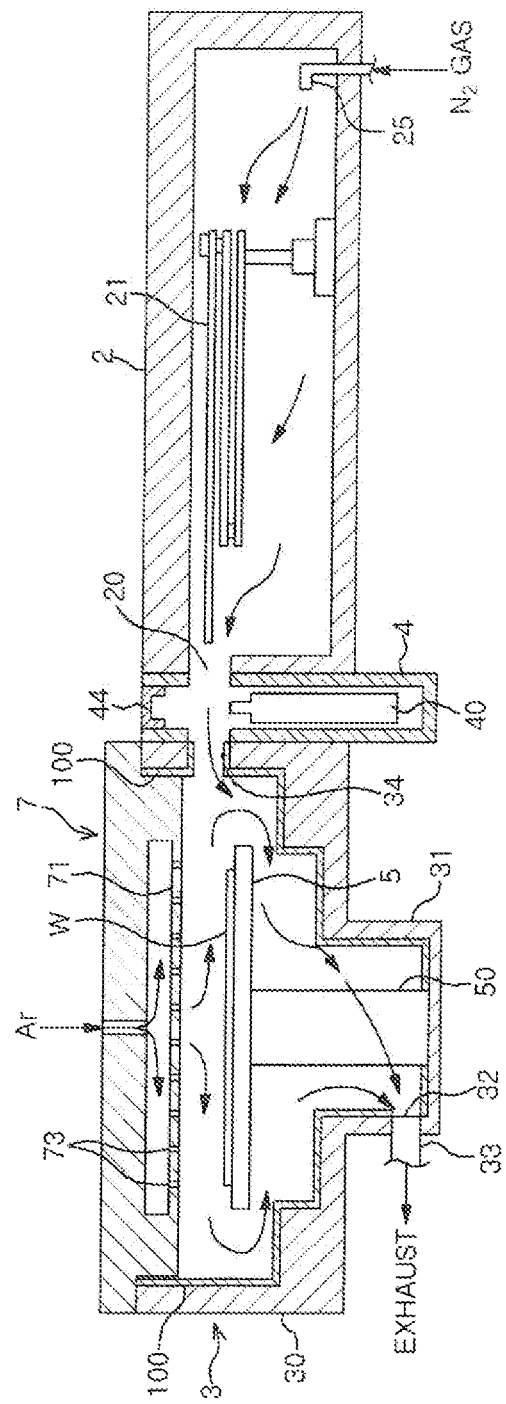

Next, the opening of the gate valve 40 starts at the time t0 shown in FIGS. 4A and 4B. At this time (t0), the pressure in the vacuum transfer chamber 2 is higher than the pressure in the processing chamber 30, so that an atmosphere in the vacuum transfer chamber 2 flows toward the processing chamber 30 as shown in FIG. 6. Accordingly, the pressure in the vacuum transfer chamber 2 is decreased and the pressure in the processing chamber 30 is increased.

In the vacuum transfer chamber 2, the pressure in the vacuum transfer chamber 2 is controlled to a constant level by controlling the flow rate of the N$_2$ gas supplied into the vacuum transfer chamber 2 based on the pressure change. Therefore, the pressure in the vacuum transfer chamber 2 is instantaneously decreased immediately after the opening of the gate valve 40 as shown in FIG. 4A. Accordingly, the supply amount of N$_2$ gas is suddenly increased as shown in FIG. 4B and the flow rate of N$_2$ gas flowing from the vacuum transfer chamber 2 into the processing chamber 30 is increased. On the other hand, in the processing chamber 30, the supply amount of Ar gas is controlled to a constant level, so that the pressure is increased without changes in the supply amount of Ar gas.

The present inventors have found that when there is a large difference between the pressure in the vacuum transfer chamber 2 and the pressure in the processing chamber 30 as will be described in the following test example, the pressure in the vacuum transfer chamber 2 is abruptly decreased and the amount of gas supplied into the vacuum transfer chamber 2 is abruptly increased at the time of opening of the gate valve 40. When the flow rate of the gas supplied into the vacuum transfer chamber 2 is abruptly increased, the flow rate of gas flowing from the vacuum transfer chamber 2 into the processing chamber 30 is also abruptly increased. Accordingly, the by-products are apt to be peeled off.

In the first embodiment, before the gate valve 40 is opened, the pressure in the vacuum transfer chamber 2 is set to be higher than the pressure in the processing chamber 30 by 25 Pa. Immediately after the gate valve 40 is opened, the flow rate of N2 gas supplied into the vacuum transfer chamber 2 is restricted to, e.g., about 2000 sccm, as shown in a graph (4) of FIG. 4B, and the pressure change in the vacuum transfer chamber 2 is reduced as shown in the graph (2) of FIG. 4A. Then, the pressure in the vacuum transfer chamber 2 quickly returns to 100 Pa.

As described in "Background of the Invention", the deposit 100 adhered to the vicinity of the transfer port 34 may scatter toward the space above the mounting table 5 by gas flow from the vacuum transfer chamber 2 into the processing chamber 30. Since, however, the sudden increase in the flow rate of $N_2$ gas flowing from the vacuum transfer chamber 2 into the vacuum processing module 3 which occurs immediately after the opening of the gate valve 40 is suppressed, the scattering of the deposit 100 adhered to the vicinity of the transfer port 34 can be suppressed.

On the surface of the mounting table 5, the gas flows from the central portion toward the peripheral portion and then flows downward from the peripheral portion. Therefore, the gas flowing from the vacuum transfer chamber 2 into the processing chamber 30 is directed to a space below the mounting table 5 together with the gas flow in the processing chamber 30 and then is discharged through the gas exhaust port provided at the lower portion of the processing chamber 30. Accordingly, even when the deposit 100 adhered to the vicinity of the transfer port 34 of the processing chamber 30 scatters by the gas flow from the vacuum transfer chamber 2 into the processing chamber 30, the deposit 100 is discharged from the lower portion of the processing chamber 30 without scattering to the space above the processed wafer W on the mounting table 5.

Thereafter, at the time t1 after the time t0 at which the gate valve 40 starts to open, the pressure in the vacuum processing module 3 is stabilized to, e.g., 90 Pa, as shown in the graph (1) of FIG. 4A, and the pressure in the vacuum transfer chamber 2 is stabilized to, e.g., 100 Pa, as shown in the graph (2) of FIG. 4A. Further, the flow rate of $N_2$ gas supplied into the vacuum transfer chamber 2 is stabilized to, e.g., 1800 sccm, as shown in the graph (4) of FIG. 4B.

Figure 7:
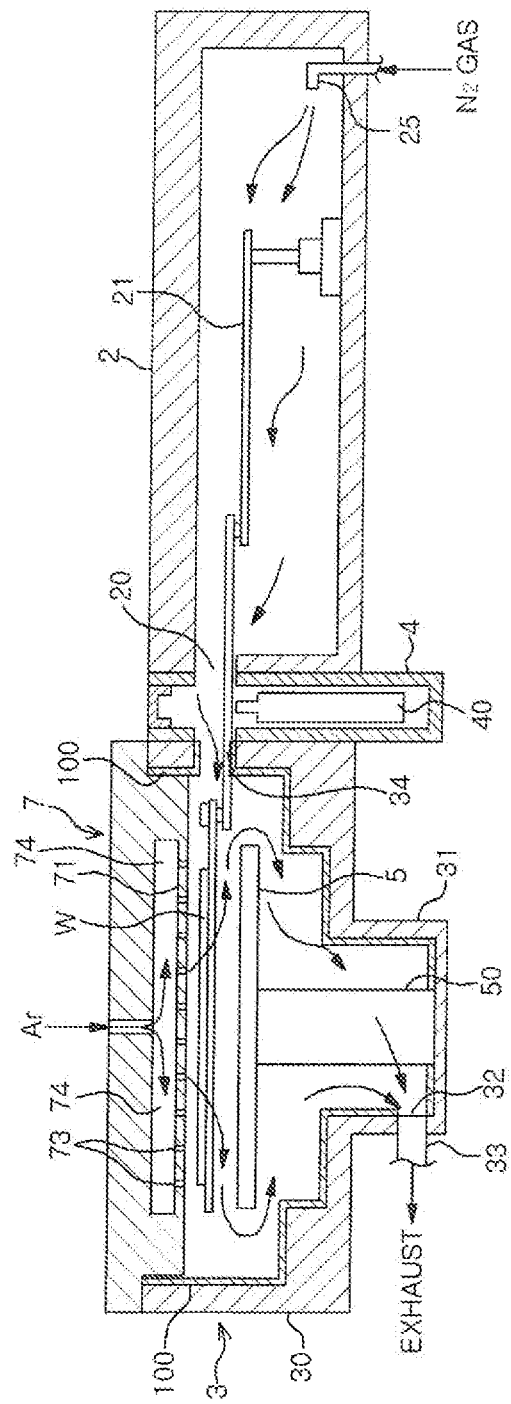
Figure 8:
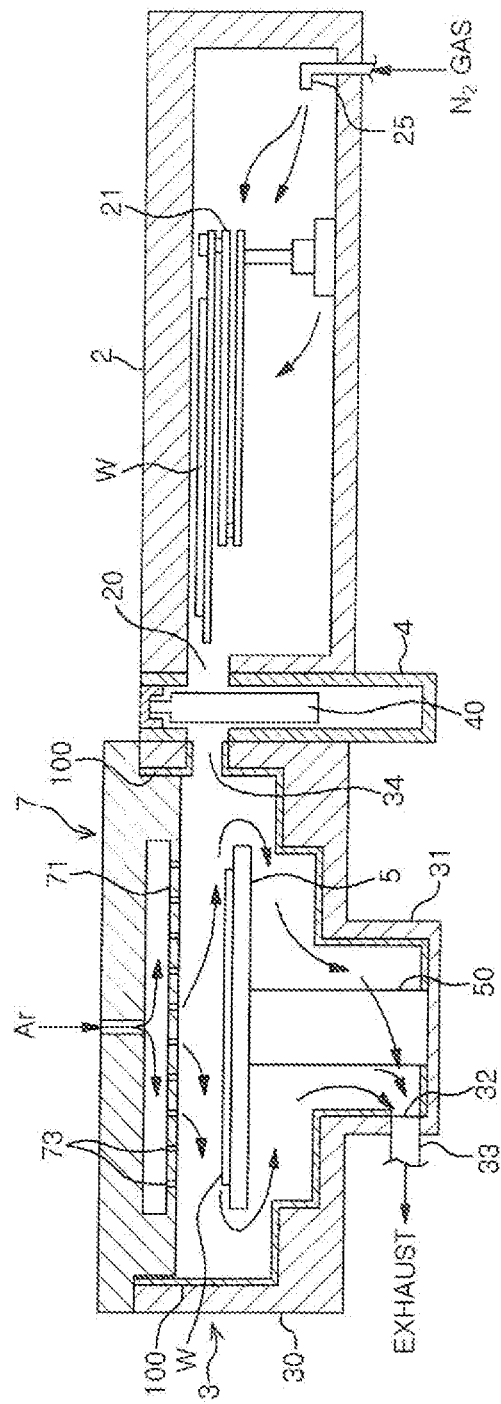

The processed wafer W on the mounting table 5 which is in a waiting state is transferred to one of the transfer arms of the second transfer unit 21 as shown in FIG. 7. The transfer arm transfers the processed wafer W to the vacuum transfer chamber 2. Thereafter, although it is not illustrated, an unprocessed wafer W is transferred to the vacuum processing module 3 and mounted on the mounting table 5 by the other transfer arm of the second transfer unit 21. Next, the transfer arm is retreated. Then, the gate valve 40 starts to be closed at the time t2 as shown in FIG. 8.

After the gate valve 40 is closed at the time t2, the vacuum processing module 3 is sealed and the pressure is decreased to 75 Pa as shown in the graph (1) of FIG. 4A. The pressure in the vacuum transfer chamber 2 is slightly increased as shown in the graph (2) and the flow rate of $N_2$ gas supplied into the vacuum transfer chamber 2 is decreased to 500 sccm as shown in the graph (4) of FIG. 4B. Accordingly, the pressure in the vacuum transfer chamber 2 returns to 100 Pa. Next, the processed wafer W returns to the original carrier C through, e.g., the load-lock chamber 13a (13b) by the second transfer unit 21.

In the first embodiment, in transferring the wafer W between the vacuum transfer chamber 2 and the processing chamber 30, Ar gas is supplied from the space above the mounting table 5 into the processing chamber 30 before the opening of the gate valve 40 that partitions between the vacuum transfer chamber 2 and the processing chamber 30. In this case, the flow rate of Ar gas is set to be smaller than that of $N_2$ gas supplied into the vacuum transfer chamber 2 and the pressure in the processing chamber 30 is set to be smaller than that in the vacuum transfer chamber 2. Therefore, when the gate valve 40 is opened, the wafer W is transferred in a state where both of the flow of $N_2$ gas from the vacuum transfer chamber 2 to the processing chamber 30 and the flow of Ar gas from the central portion to the peripheral portion of the surface of the mounting table 5 and then directed downward from the peripheral portion of the mounting table 5 are maintained. Therefore, the scattering of the deposit 100 toward the space above the mounting table 5 in the vacuum processing module 3 is suppressed. Accordingly, the adhesion of the particles onto the wafer W can be suppressed and, also, the contamination due to the particles flowing from the processing chamber 30 into the vacuum transfer chamber 2 by the gas flow can be suppressed.

Since the flow rate of $N_2$ gas that suddenly flows from the vacuum transfer chamber 2 into the processing chamber 30 at the time of opening the gate valve 40 is suppressed, the contamination of the processing chamber 30 by the scattering of the particles adhered to the processing chamber 30 is also suppressed.

In the present embodiment, the flow rate of Ar gas supplied into the processing chamber 30 was set to 200 sccm (ml/min). However, in consideration of protection of the surface of the wafer W and backward diffusion of the gas into the vacuum transfer chamber 2, it is preferable to set the flow rate of Ar gas to be greater than or equal to 50 sccm and smaller than or equal to 1000 sccm.

In view of reduction of the flow rate of $N_2$ gas flowing from the vacuum transfer chamber 2 to the processing chamber 30, it is preferable to reduce the flow rate of $N_2$ gas supplied into the vacuum transfer chamber 2 during a period from when the gate valve 40 starts to open to when the gate valve 40 is closed to about 3000 sccm or less.

In order to suppress sudden increase in the flow rate of $N_2$ gas supplied into the vacuum transfer chamber 2, a transfer function used in the PID operation unit 83 of the controller 8 is adjusted. In the PID control, the increase/decrease speed (response speed) of the flow rate of $N_2$ gas supplied into the vacuum transfer chamber 2 is determined by the transfer function when the pressure in the vacuum transfer chamber 2 is changed. Therefore, when the pressure in the vacuum transfer chamber 2 is decreased, the increase speed of the flow rate of $N_2$ gas can be decreased (responsiveness can be decreased) by adjusting, e.g., values of a proportional gain, a differential gain and an integral gain used for the transfer function. Accordingly, the sudden increase in the flow rate of $N_2$ gas can be suppressed. The controller 8 controls the response speed of the flow rate of the pressure control valve 28 for increasing/decreasing the flow rate of $N_2$ gas, and it corresponds to a flow rate of a speed control unit.

In order to further reliably suppress the sudden increase in the flow rate of $N_2$ gas supplied into the vacuum transfer chamber 2, it is preferable to reduce a difference between the pressure in the vacuum transfer chamber 2 and the pressure in the vacuum processing module 3 such as the film forming apparatus or the like at the time of opening the gate valve 40.

If the pressure difference is too large, the flow rate of $N_2$ gas suddenly flowing into the vacuum transfer chamber 2 is increased and the flow rate of $N_2$ gas flowing from the vacuum transfer chamber 2 into the vacuum processing module 3 is easily increased. If the pressure difference is too small, when the gate valve 40 is opened, backward diffusion of an atmosphere in the processing chamber 30 to the vacuum transfer chamber 2 may occur. Therefore, it is preferable to set the pressure in the vacuum transfer chamber 2 to be higher than the pressure in the processing chamber 30 by 10 Pa to 50 Pa and more preferably by 20 Pa to 40 Pa.

Figure 9:
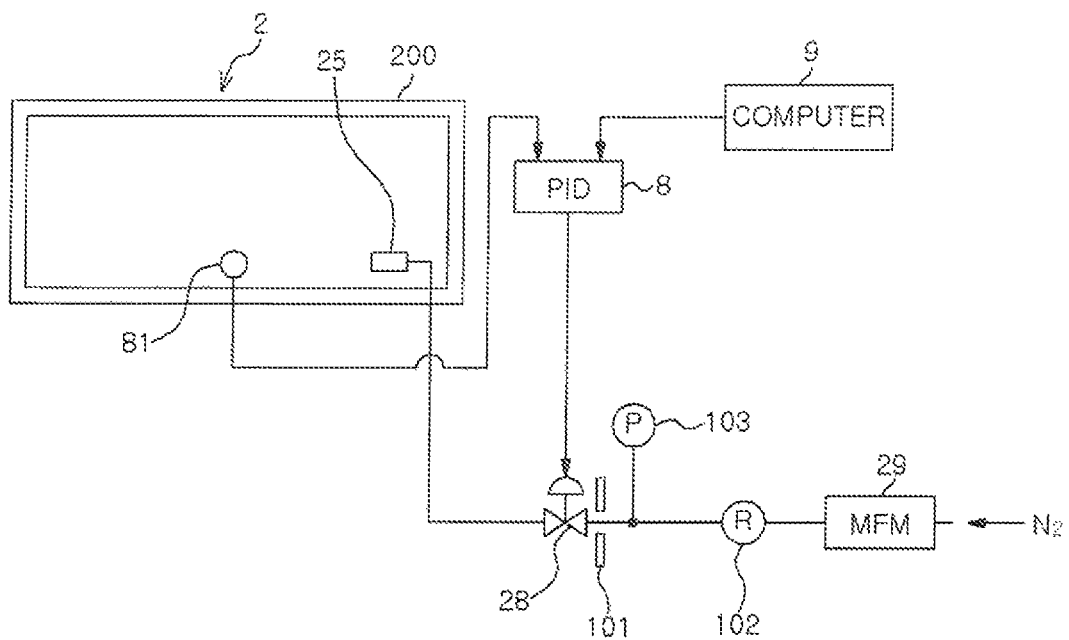
FIG. 9 explains an $N_2$ gas supply unit provided in the vacuum transfer chamber.

Or, as shown in FIG. 9, an orifice 101 and a pressure regulator 102 for suppressing a flow rate increase speed may be provided at an upstream side of the pressure control valve 28 in the $N_2$ gas supply line 26 connected to the vacuum transfer chamber 2. In the example shown in FIG. 9, the orifice 101 and the pressure regulator 102 are provided between the pressure control valve 28 and the MFM 29, and the pressure regulator 102 is provided at the upstream side of the orifice 101. A reference numeral 103 in the drawing represents a pressure gauge.

By controlling an inner diameter of the orifice 101 and a set pressure of the pressure regulator 101 in advance in the above configuration, even when the pressure in the vacuum transfer chamber 2 is instantaneously decreased and the opening degree of the pressure control valve 28 is increased, an excessive increase in the flow rate of $N_2$ gas is suppressed by the orifice 101. Therefore, a sudden increase in the flow rate of $N_2$ flowing into the vacuum transfer chamber 2 can be prevented.

The vacuum processing module 3 may be, e.g., an etching apparatus, an annealing apparatus or the like. The vacuum processing apparatus is not limited to a multi-chamber system and may have a configuration in which a load-lock chamber serving as the vacuum transfer chamber 2 is connected to a standalone type vacuum processing module.

Second Embodiment

The vacuum processing apparatus according to the second embodiment will be described. In the second embodiment, a processed wafer W is unloaded from the processing chamber 30 while supplying an inert gas from the gas shower head 7 into the processing chamber 30 and, then, an unprocessed wafer W is loaded after stopping the supply of the inert gas.

For example, as in the aforementioned embodiment, after the wafer W is processed in the processing chamber 30, Ar gas as an inert gas is supplied at a flow rate of, e.g., 200 sccm, into the processing chamber 30 and $N_2$ gas is supplied at a flow rate of, e.g., 500 sccm, from the $N_2$ gas supply unit 25 into the vacuum transfer chamber 2, as shown in FIG. 5. Next, as shown in FIG. 5, the gate valve 40 is opened in a state where the pressure in the processing chamber 30 is set to, e.g., 75 Pa, and the pressure in the vacuum transfer chamber 2 to, e.g., 100 Pa, that is higher than the pressure in the processing chamber 30. Further, as shown in FIG. 7, the processed wafer W on the mounting table 5 is received by one of the transfer arms of the second transfer unit 21 and transferred into the vacuum transfer chamber 2. Next, the gate valve 40 is closed and the supply of Ar gas from the gas shower head 7 into the processing chamber 30 is stopped (flow rate: 0 sccm).

In the first embodiment, the processed wafer W in the processing chamber 30 is transferred into the vacuum transfer chamber 2 and, then, consecutively an unprocessed wafer W in the vacuum transfer chamber 2 is transferred into the processing chamber 30. However, the second embodiment is different from the first embodiment in that the gate valve 40 is once closed and the supply of Ar gas from the gas shower head 7 is stopped after the processed wafer W in the processing chamber 30 has been transferred into the vacuum transfer chamber 2.

Figure 10:
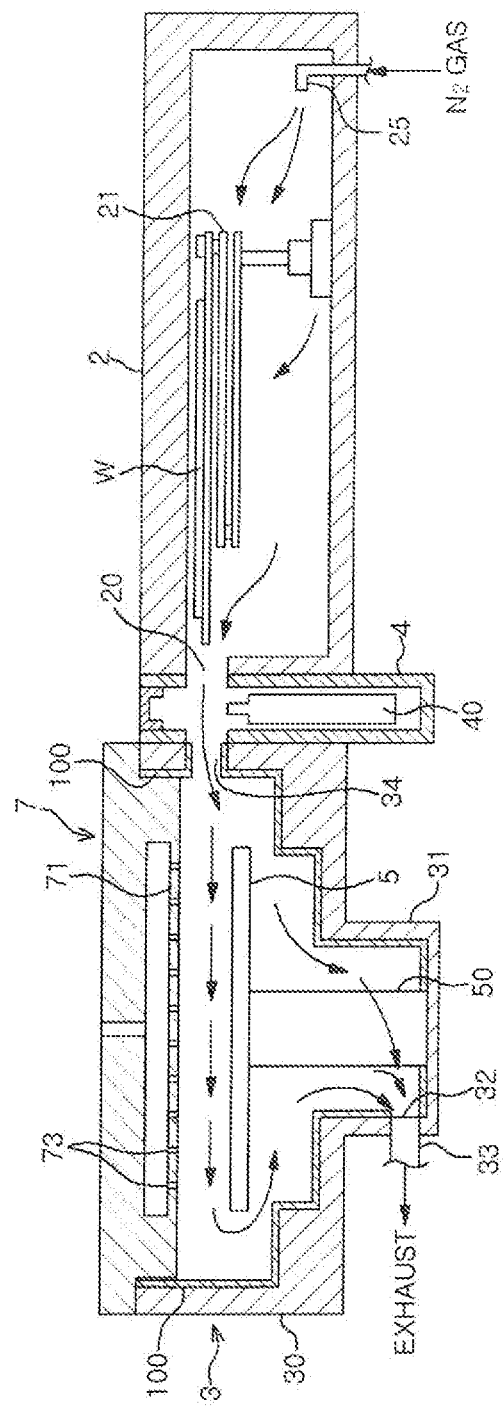
FIG. 10 explains operations of a vacuum processing apparatus according to a second embodiment.

Next, when the gate valve 40 is opened, the gas flows from the vacuum transfer chamber 2 into the processing chamber 30 and is discharged from the lower portion of the processing chamber 30 and, at the same time, the gas flows over the mounting table 5 from the transfer port 34 side toward the far side in the processing chamber 30, as shown in FIG. 10. Due to such a gas flow from the vacuum transfer chamber 2, a deposit adhered to the inner surface of the processing chamber 39 is peeled off. Especially, a deposit, which may be easily scattered, adhered to the vicinity of the transfer port 34 is peeled off. Particles scattered in the processing chamber 30 are also discharged together with $N_2$ gas.

In a state where there is formed the gas flow which flows from the vacuum transfer chamber 2 into the processing chamber 30 moves from the transfer port 34 side toward the far side in the processing chamber 30 over a top surface of the mounting table 5, an unprocessed wafer W is loaded into the processing chamber 30 and delivered to the mounting table 5 by the second transfer unit 21. At this time, particles in the processing chamber 30 are removed by the gas flow directed from the vacuum transfer chamber 2 into the processing chamber 30, and adhesion of the particles onto the unprocessed wafer W is prevented by the gas flow directed from the transfer port 34 side toward the far side in the processing chamber 30 over the mounting table 5. Then, the second transfer unit 21 is retreated to the vacuum transfer chamber 2 and the gate valve 40 is closed so that the unprocessed wafer W can be processed. In the above description, the unprocessed wafer W is loaded in a state where the gas flows from the vacuum transfer chamber 2 into the processing chamber 30. However, the gas flow may be formed once immediately before the loading of the unprocessed wafer W.

Figure 11:
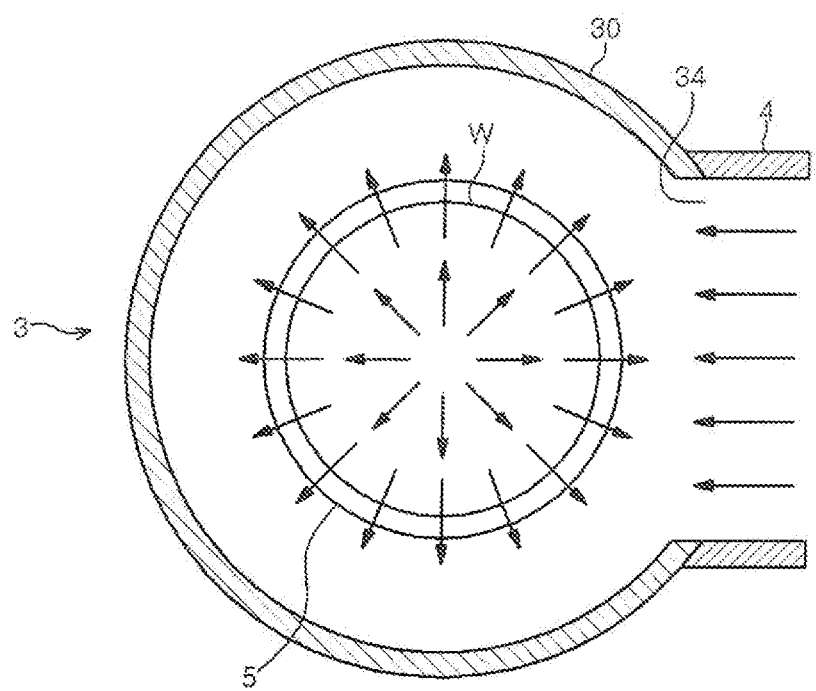
FIGS. 11 and 12 explain a gas flow at the time of unloading a processed wafer from a processing chamber.
Figure 12:
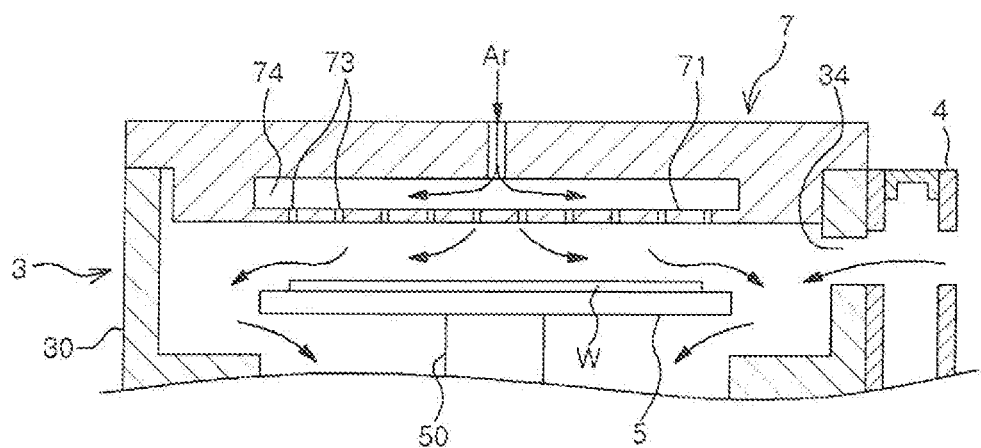

The flow of the inert gas in the processing chamber 30 in the second embodiment will be described with reference to FIGS. 11 to 14. In FIGS. 11 to 14, the vacuum processing module 3 and the gate chamber 4 are illustrated simply and the vacuum transfer chamber 2 is omitted. When the processed wafer W is unloaded from the processing chamber 30, the inert gas is supplied at a first flow rate from the gas shower head 7 and the pressure in the processing chamber 30 is set to be lower than that in the vacuum transfer chamber 2. Therefore, as shown in FIGS. 11 and 12, the inert gas flows radially along a top surface of the mounting table 5 and then flows toward the lower portion of the processing chamber 30.

Figure 13:
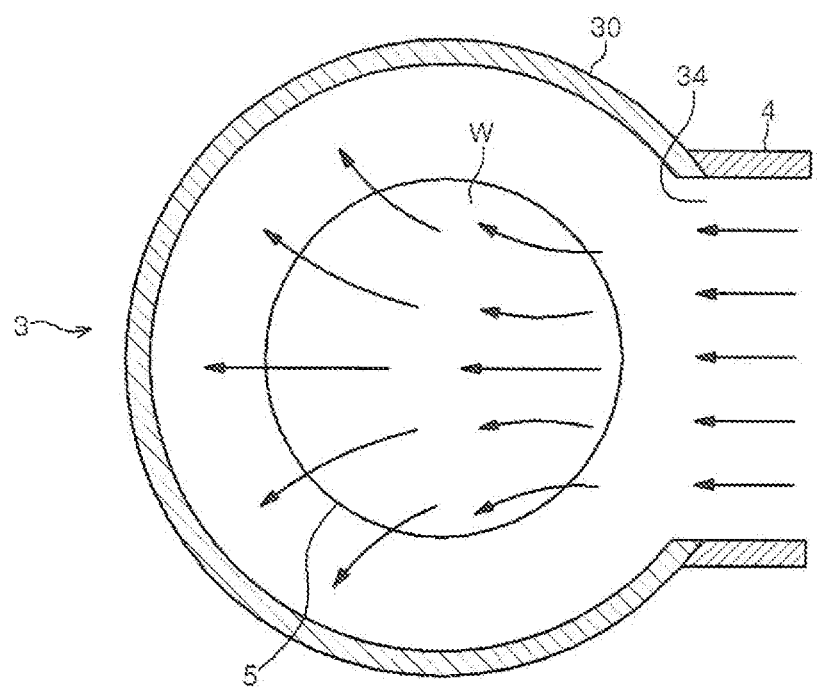
FIGS. 13 and 14 explain a gas flow at the time of loading an unprocessed wafer into the processing chamber.
Figure 14:
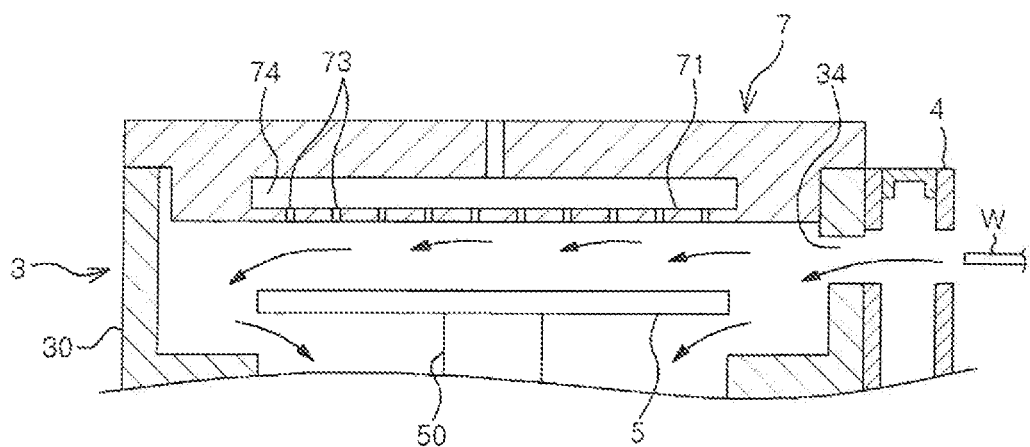

When an unprocessed wafer W is loaded into the processing chamber 30 from the vacuum transfer chamber 2, the inert gas is supplied from the gas shower head 7 at a second flow rate smaller than the first flow rate. For example, the supply of the inert gas is stopped (i.e., the second flow rate is set to 0 sccm). Further, the pressure in the processing chamber 30 is set to be lower than that in the vacuum transfer chamber 2. Accordingly, as shown in FIGS. 13 and 14, there is formed the gas flow in which the gas flowing from the transfer port 34 into the processing chamber 30 moves over the mounting table 5 and then is discharged to the lower portion of the processing chamber 30.

In the second embodiment, after the processed wafer W is transferred from the processing chamber 30 into the vacuum transfer chamber 2 and before the unprocessed wafer W is loaded into the processing chamber 30, the gate valve 40 is closed and the supply of Ar gas from the gas shower head into the processing chamber 30 is stopped. Therefore, when the gate valve 40 is opened, the gas flows from the vacuum transfer chamber 2 into the processing chamber 30 and flows over the surface of the mounting table 5. Since the deposit, which may be easily scattered, among the deposit adhered to the vicinity of the transfer port 34 in the processing chamber 30 is removed by the gas flow, the adhesion of particles at the time of loading the unprocessed wafer W can be prevented and, also, the adhesion of the particles onto the processed wafer W at the time of unloading the processed wafer W is suppressed.

In the above-described embodiment, when an unprocessed wafer W is loaded, the flow rate of Ar gas supplied from the gas shower head 7 is set to 0 sccm. However, a small amount of Ar gas may be supplied. In that case, before the processed wafer W is transferred from the processing chamber 30 into the vacuum transfer chamber 2, it is required to reduce the flow rate of the inert gas supplied from the gas shower head 7 at the time of transferring the unprocessed wafer W from the vacuum transfer chamber 2 into the processing chamber 30 to be smaller than the flow rate of the inert gas supplied from the gas shower head 7 at the time of opening the gate valve 40 before transferring the processed wafer W from the processing chamber 30 into the vacuum transfer chamber 2. As a result, when the unprocessed wafer W is transferred from the vacuum transfer chamber 2 into the processing chamber 30, the gas flows from the vacuum transfer chamber 2 into the processing chamber 30 and the gas flow moving over the mounting table 5 is formed, as shown in FIGS. 13 and 14.

After the processed wafer W is unloaded from the processing chamber 30, an unprocessed wafer W may be loaded into the processing chamber 30 in a state where the flow rate of gas supplied from the gas shower head 7 is reduced without closing the gate valve 40. However, in order to enhance the effect of removing particles by the gas flow directed from the vacuum transfer chamber 2 into the processing chamber 30, it is preferable to close the gate valve 40 before the flow rate of Ar gas supplied from the gas shower head 7 is changed. By closing the gate valve 40, the pressure in the vacuum transfer chamber 2 and the pressure in the processing chamber 30 can be individually controlled. Accordingly, a pressure difference is generated and the particle removal effect at the time of opening the gate valve 40 is increased. Since the flow rate of $N_2$ gas is adjusted by controlling the pressure in the vacuum transfer chamber 2, the effect due to the change in the flow rate of the gas in the processing chamber 30 can be avoided by closing the gate valve 40. Therefore, it is possible to prevent the change in the gas supply amount to the vacuum transfer chamber 2 caused by the change in the pressure in the vacuum transfer chamber 2 due to the change in the flow rate of the gas in the processing chamber 30. As a result, the flow rate of the gas in the vacuum transfer chamber 2 can be easily stabilized.

After the processed wafer W is unloaded from the processing chamber 30 and the gate valve 40 is closed, the deposit in the processing chamber 30 may be stabilized by performing plasma processing in the processing chamber 30 as a processing recipe after film formation. Next, the gate valve 40 may be opened in a state where the flow rate of Ar gas supplied from the gas shower head 7 is reduced or the supply of Ar gas is stopped. Accordingly, it is possible to efficiently remove the deposit adhered to the inner surface of the processing chamber 30 before an unprocessed wafer W is loaded into the processing chamber 30 and also possible to make scattering of particles difficult. As the processing recipe after the film formation, a nitriding process for stabilizing the deposit adhered to the processing chamber 30 or a purge process using the supply of gas into the processing chamber 30 may be performed. When the processing recipe after film formation is executed, the gate valve 40 may be opened.

TEST EXAMPLE

The following tests were performed to examine the effects of the embodiments of the present disclosure.

Test Example 1

In the vacuum processing apparatus of the first embodiment, the pressure in the vacuum transfer chamber 2 was set to 100 Pa and the pressure in the processing chamber 30 was set to 75 Pa. The gate valve 40 was closed after 26 seconds from the opening of the gate valve 40. The flow rate of $N_2$ gas supplied into the vacuum transfer chamber 2 before the opening of the gate valve 40 was set to 500 sccm. In the vacuum processing module 3, Ar gas was supplied at a flow rate of 200 sccm from the gas shower head 7.

Comparative Example 1

A comparative example 1 was performed under the same conditions as the test example 1 except that the pressure in the processing chamber 30 before the opening of the gate valve 40 was set to 20 Pa and the responsiveness of the PID operation unit 83 and the flow rate increase/decrease speed were increased.

Figure 15:
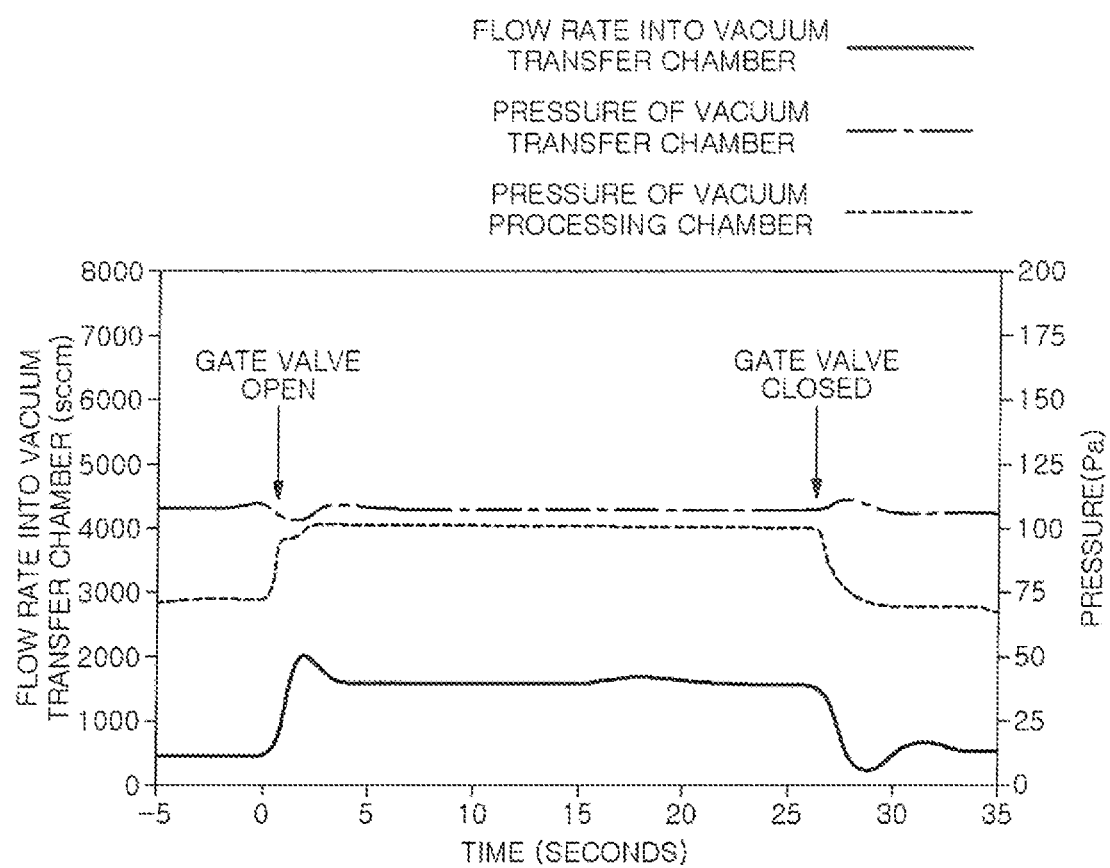
FIG. 15 is a characteristic view showing changes in a pressure and a flow rate of an inert gas in a test example 1.
Figure 16:
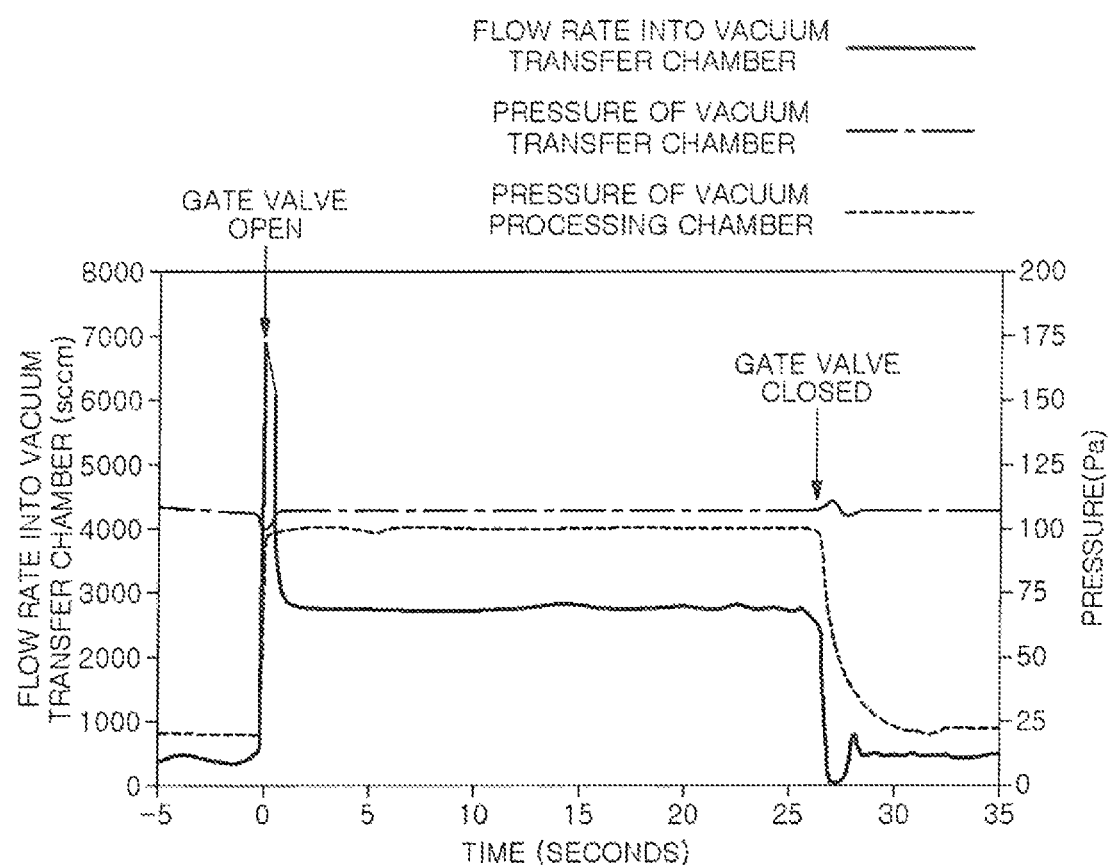
FIG. 16 is a characteristic view showing changes in a pressure and a flow rate of an inert gas in a comparative example 1.

In each of the test example 1 and the comparative example 1, the pressure in the vacuum transfer chamber 2, the pressure in the processing chamber 30, and the supply amount of $N_2$ gas in the vacuum transfer chamber 2 were measured for 40 seconds from five seconds before the opening of the gate valve 40. FIGS. 15 and 16 show changes in the pressure in the vacuum transfer chamber 2, the pressure in the processing chamber 30, and the supply amount of $N_2$ gas in the vacuum transfer chamber 2 with respect to time (sec).

In FIGS. 15 and 16, the time at which the opening of the gate valve 40 starts is set to 0.

As shown in FIG. 15, in the test example 1, the flow rate of $N_2$ gas supplied into the vacuum transfer chamber 2 was increased to about 2000 sccm immediately after the opening of the gate valve 40 and maintained at about 1800 sccm until the closing of the gate valve 40.

As shown in FIG. 16, in the comparative example 1, the flow rate of $N_2$ gas supplied into the vacuum transfer chamber 2 was increased to about 7000 sccm immediately after the opening of the gate valve 40 and maintained at about 3000 sccm until the closing of the gate valve 40. The above result shows that the vacuum processing apparatus according to the embodiment can prevent sudden increase in the flow rate of $N_2$ gas supplied into the vacuum transfer chamber 2 immediately after the opening of the gate valve 40.

The wafer W was processed by using the same vacuum processing apparatus as that used in the test example 1, and the number of particles of the wafers W unloaded from the processing chamber 30 was detected. For example, 699 wafers W were processed, and the number of particles of the fifth wafer W, the $50^{th}$ wafer W, the $100^{th}$ wafer W, the $199^{th}$ wafer W, the $299^{th}$ wafer W, the $399^{th}$ wafer W, the $499^{th}$ wafer W, the $599^{th}$ wafer W, and the $699^{th}$ wafer W were counted.

Comparative Example 2

In a comparative example 2, the wafer W was processed by using the same vacuum processing apparatus as that used in the comparative example 1 except that Ar gas was not supplied into the processing chamber 30 during the opening/closing of the gate valve 40. Then, the number of particles of the wafers W unloaded from the processing chamber 30 was detected. For example, 399 wafers W were processed, and the number of particles of the second wafer W, the $49^{th}$ wafer W, the $99^{th}$ wafer W, the $199^{th}$ wafer W, the $299^{th}$ wafer W, and the $399^{th}$ wafer W were counted.

In the test example 1, the average of the number of detected particles was 8.9. In the comparative example 2, the number of particles was increased from the $99^{th}$ wafer W. In the $99^{th}$ wafer W, 47 particles were detected. In the $199^{th}$ wafer W, The number of particles was abruptly increased to 1632. The average of the number of detected particles was greater than 1000.

The above result shows that the number of particles adhered to the wafer W can be reduced by using the vacuum processing apparatus according to the embodiment.

Test Examples 2 and 3

In the test example 2, a wafer W that has been processed by the vacuum processing apparatus according to the second embodiment was used. In the test example 2, the gate valve 40 was opened/closed while setting the pressure in the vacuum transfer chamber 2 to 100 Pa and the pressure in the processing chamber 30 at the time of unloading the processed wafer W to 60 Pa. The flow rate of $N_2$ gas supplied into the vacuum transfer chamber 2 before the opening of the gate valve 40 was set to 500 sccm. The flow rate of Ar gas supplied from the gas shower head 7 before the transfer of the processed wafer W from the vacuum processing module 3 into the vacuum transfer chamber 2 was set to 200 sccm. The supply of Ar gas from the gas shower head 7 was stopped (0 sccm) before the loading of an unprocessed wafer W from the vacuum transfer chamber 2 into the vacuum processing module 3.

In the test example 2, the number of particles detected from the processed wafer W unloaded from the processing chamber 30 was examined. For example, 700 wafers W were processed, and the number of particles (having diameter of 45 nm or above) in the fifth wafer W, the $50^{th}$ wafer W, the $100^{th}$ wafer W, the $200^{th}$ wafer W, the $300^{th}$ wafer W, the $400^{th}$ wafer W, the $500^{th}$ wafer W, the $600^{th}$ wafer W, and the $700^{th}$ wafer W were counted.

A test example 3 was performed under the same conditions as the test example 1 except that the pressure in the processing chamber 30 was set to 60 Pa. In the test example 3, the number of particles (having diameter of 45 nm or above) in the fifth wafer W, the $25^{th}$ wafer W, the $50^{th}$ wafer W, the $100^{th}$ wafer W, the $200^{th}$ wafer W, the $300^{th}$ wafer W, the $400^{th}$ wafer W, the $499^{th}$ wafer W, the $599^{th}$ wafer W, and the $699^{th}$ wafer W were counted.

Figure 17:
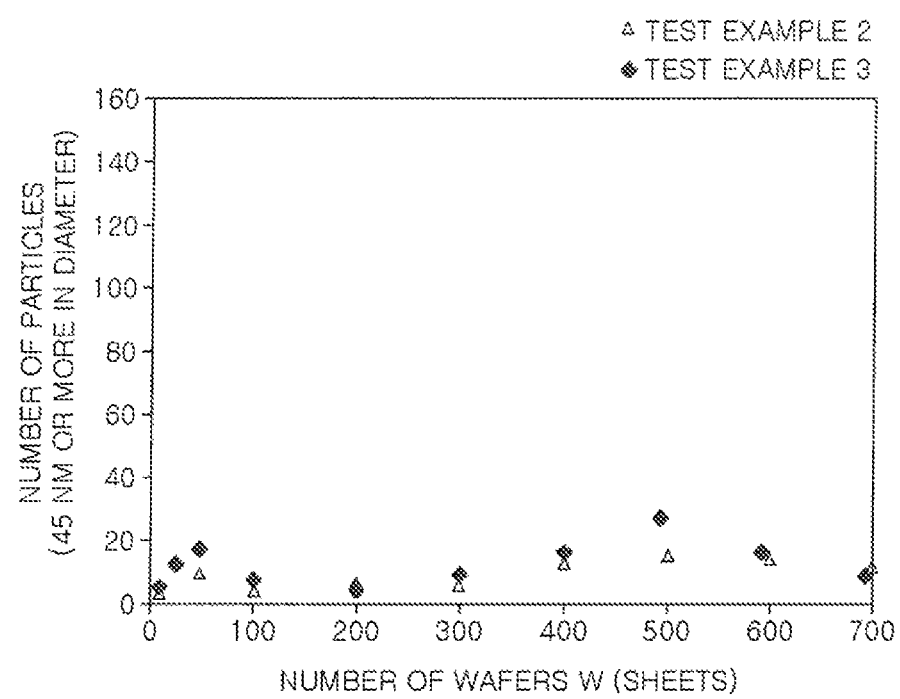
FIG. 17 is a characteristic view showing the number of wafers and the number of particles in test examples 2 and 3.

The result thereof is shown in FIG. 17. FIG. 17 is a characteristic view showing the number of wafers W and the number of detected particles in the test examples 2 and 3. As shown in FIG. 17, the number of particles detected in the test example 2 was 20 or less and the number of particles detected in the test example 3 was 30 or less. Therefore, it has been confirmed that the number of particles detected in the test examples 2 and 3 is considerably smaller than that detected in the comparative example 2. Further, the number of particles detected in the test example 2 is smaller than that detected in the test example 3.

In each of the test examples 2 and 3, the number of particles adhered to the $12^{th}$ processed wafer W was counted. Five particles were detected in the test example 2, and 20 particles were detected in the test example 3.

Therefore, it has been confirmed that the number of particles adhered onto the processed wafer W can be further reduced by, at the time of loading an unprocessed wafer W into the processing chamber 30 from the vacuum transfer chamber 2, stopping the supply of the inert gas from the gas shower head 7 and allowing gas flow from the vacuum transfer chamber 2 into the processing chamber 30.

While the disclosure has been shown and described with respect to the embodiments, it will be understood by those skilled in the art that various changes and modifications may be made without departing from the scope of the disclosure as defined in the following claims.

What is claimed is:

1. An operation method of a vacuum processing apparatus including:
   a vacuum processing module including a processing chamber having a transfer port for a substrate, a mounting table provided in the processing chamber, and a first gas supply unit configured to supply a first inert gas in a shower pattern toward the mounting table, and a first gas exhaust port formed below the mounting table and configured to vacuum-evacuate the processing chamber,
   a vacuum transfer module including a transfer chamber airtightly connected to the processing chamber through the transfer port, a transfer unit configured to transfer the substrate with respect to the processing chamber, a second gas supply unit configured to supply a second inert gas into the transfer chamber, and a second gas exhaust port configured to vacuum-evacuate the transfer chamber, and
   a gate valve configured to open and close the transfer port for the substrate, the method comprising:
   setting a state in which a flow rate of the first inert gas supplied from the first gas supply unit is smaller than a flow rate of the second inert gas supplied from the second gas supply unit and a pressure in the processing chamber is lower than a pressure in the transfer chamber, wherein the flow rate of the first inert gas during the set state is maintained at a first flow rate;
   opening the gate valve in the set state;
   transferring a processed substrate from the processing chamber into the transfer chamber by the transfer unit while maintaining the set state;
   forming a gas flow from the transfer chamber into the processing chamber by setting the flow rate of the first inert gas supplied from the first gas supply unit at a second flow rate smaller than the first flow rate after said transferring the processed substrate;
   transferring an unprocessed substrate from the transfer chamber into the processing chamber while maintaining the second flow rate of the first inert gas after said forming the gas flow; and
   closing the gate valve,
   wherein the second flow rate is 0 sccm,
   wherein during said transferring the processed substrate, the first inert gas whose flow rate is maintained at the first flow rate flows from a central portion of the mounting table toward a peripheral portion of the mounting table to generate a first inert gas flow in the processing chamber and the second inert gas flowing from the transfer chamber into the processing chamber is directed to a space below the mounting table together with the first inert gas flow in the processing chamber without scattering of particles to a space above the mounting table,
wherein during said forming the gas flow, the flow rate of the first inert gas is maintained at 0 sccm and the second inert gas flowing from the transfer chamber into the processing chamber flows over the mounting table to prevent adhesion of the particles onto the unprocessed substrate.

2. The operation method of claim 1, wherein a maximum flow rate of the second inert gas supplied from the second gas supply unit into the transfer chamber during a period from the opening to the closing of the gate valve is 3000 ml/min or less.

3. The operation method of claim 1, wherein a difference between a pressure in the processing chamber and a pressure in the transfer chamber at the time of starting the opening of the gate valve is greater than or equal to 10 Pa and smaller than or equal to 50 Pa.

4. The operation method of claim 1, further comprising, after said transferring the processed substrate from the processing chamber into the transfer chamber and before said forming the gas flow:
closing the gate valve; and
performing a process after a film formation for suppressing scattering of the particles in the processing chamber.

5. The operation method of claim 4, wherein the process after the film formation is a plasma process, a nitriding process or a purge process for stabilizing the particles in the processing chamber.

* * * * *